United States Patent [19]

Husimi et al.

[11] 4,340,899
[45] Jul. 20, 1982

[54] EPITAXIAL INTEGRATED E-DE SOLID STATE DETECTOR TELESCOPE

[76] Inventors: Kazuo Husimi, 32, Naka machi, Kodaira City, Tokyo; Chisu Kim, 1-380, Ogawa, Kodaira City, Tokyo both of Japan

[21] Appl. No.: 117,352
[22] Filed: Jan. 31, 1980

[30] Foreign Application Priority Data

Sep. 27, 1979 [JP] Japan .................... 54-124885

[51] Int. Cl.$^3$ .................................................. H01L 27/14
[52] U.S. Cl. ........................................ 357/29; 357/15; 357/30; 357/89
[58] Field of Search ................... 357/30, 89, 29, 15

[56] References Cited
U.S. PATENT DOCUMENTS 4,160,985  7/1979  Kamins ...................... 357/30

*Primary Examiner*—Martin H. Edlow
*Attorney, Agent, or Firm*—Donald D. Mon

[57] ABSTRACT

An epitaxial integrated E-dE solid state detector telescope comprising a dE detector produced on an epitaxial layer and a E detector produced on a high purity silicon layer, both of which are fabricated on a single silicon wafer having N-N+-N type complex structure. Said dE and E detectors are electrically isolated by a very low resistive N+ type silicon layer, which is produced on the high purity N type silicon substrate by impurity diffusion technique and is buried under the epitaxial silicon layer. Electrodes of dE and E detectors are produced on both sides of the silicon wafer by means of evaporation of gold in a vacuum. Said electrodes are reverse biased and depletion layers which act as active regions of dE and E detectors are extended from outsides toward said buried layer, providing independent charge collections of carries produced by incident charged particles in dE and E detectors by said electrodes.

11 Claims, 5 Drawing Figures

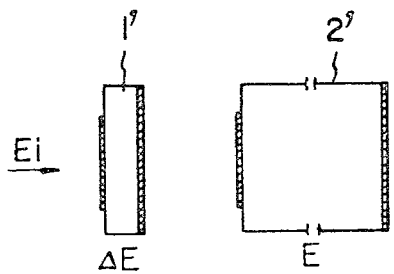
FIG. 1
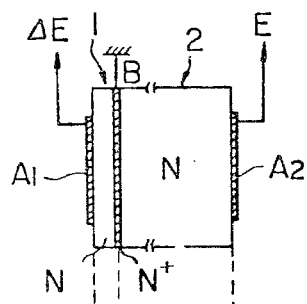
FIG. 2(a)
FIG. 2(b)
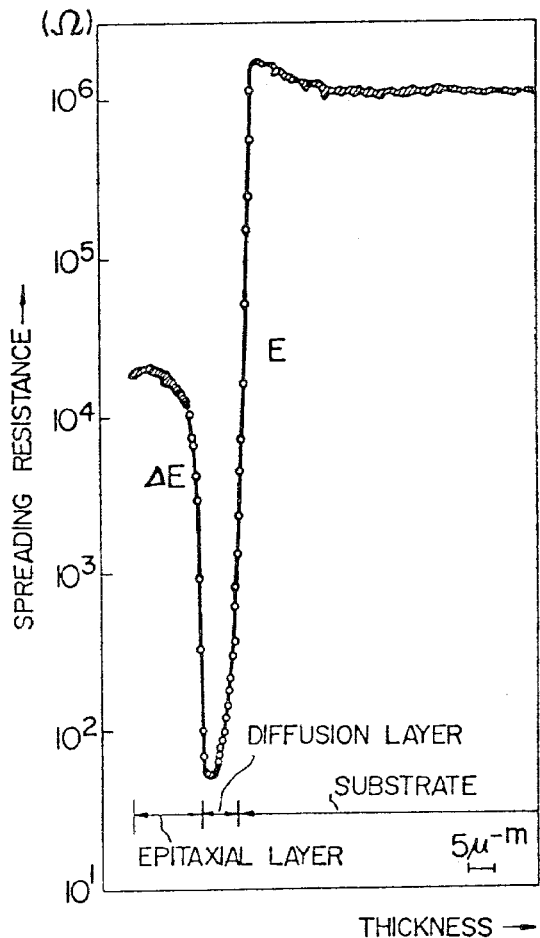
FIG. 4

EPITAXIAL INTEGRATED E-DE SOLID STATE DETECTOR TELESCOPE

BACKGROUND OF THE INVENTION

The present invention relates to a solid state detector telescope which is composed of a relatively thin dE detector and a thick E detector and is used for identifying charged particles and measuring incident energy of the particles.

Heretofore, dE and E detectors used for this purpose are produced individually. For identifying heavy and low energy charged particles, a thin detector with a thickness less than 10 μm is required as the dE detector of this solid state detector telescope. This thin detector has been produced from an epitaxial silicon wafer by etching off the highly doped substrate using a chemical preferential etching technique or electrochemical etching technique. However, this method has drawbacks that the dE detector suffers a degradation of thickness uniformity caused by etching irregularities and also the etching process itself is laborious. The purpose of the present invention is to eliminate said drawbacks, providing a new type of detector which integrates dE and E detectors in a single block.

BRIEF SUMMARY OF INVENTION

An object of the present invention is to provide an epitaxial integrated E-dE solid state detector telescope using an epitaxial crystal growth technique combined with an impurity diffusion technique whereby the thin dE detector is produced without employing a highly technical process of etching the substrate.

The second object of the present invention is to provide an epitaxial integrated E-dE solid state detector telescope which has a thin dE detector with highly uniform thickness eliminating an additional non-uniformity which might appear caused by etching the substrate.

The third object of the present invention is to provide an epitaxial integrated E-dE solid state detector telescope which is compact and rugged and is easy to handle because it is fabricated on a single semiconductor wafer.

The fourth object of the present invention is to provide an epitaxial integrated E-dE solid state detector telescope which eliminates a separation of dE and E detectors whereby an unfavourable counting loss in the E detector caused by a scattering of charged particles in the dE detector is minimized.

Other and further objects, features and advantages of the invention will appear more fully in the following description.

P type materials may be used instead of N type, which is dealt with in the following description.

Ion inplantation technique and epitaxial crystal growth technique may be used instead of an impurity diffusion technique for producing said very low resistive layer, which is buried by the epitaxial layer.

BRIEF DESCRIPTION OF THE DRAWINGS

In the Drawing

FIG. 1 shows a solid state detector telescope composed of individually produced E and dE detectors illustrated for explaining the background of the present invention.

FIG. 2(a) shows a structure illustrating an epitaxial integrated E-dE detector telescope of the first embodiment of the present invention and FIG. 2(b) shows a graph illustrating a potential distribution in this detector.

FIG. 4 shows a graph illustrating a profile of the spreading resistance of the silicon wafer used for producing said example of the integrated E-dE solid state detector telescope of the present invention.

DETAILED DESCRIPTION

Figure 3:
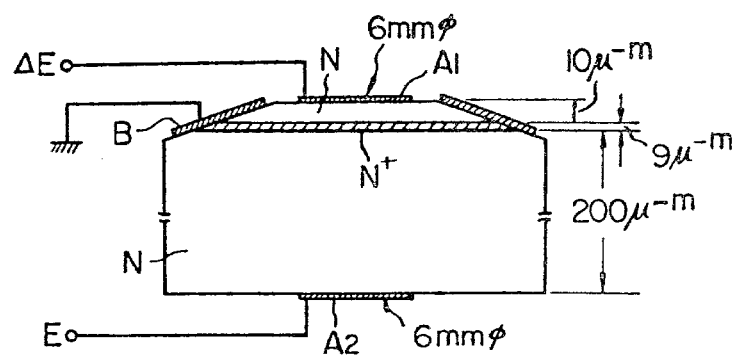
FIG. 3 is a structure illustrating the geometry and an electrode configuration of one example of the present invention which is produced for confirming usefulness of the present invention.

Referring to the attached drawings, in FIG. 1, there is shown the solid state detector telescope composed of dE and E detectors produced individually for explaining the background of the present invention and in FIG. 2 to FIG. 5, there are shown the first embodiment of the present invention.

In the FIG. 1, 1 and 2 are dE and E detectors placed in parallel on the same axis consisting the solid state detector telescope heretofore used. $E_i$ is the energy of incident particles and $\Delta E$ and $E$ are energy losses of particles in dE and E detectors respectively. If incident particles stop in the E detector consuming all of the energy, the energy of incident particles $E_i$ can be obtained by the following relation $$E_i = \Delta E + E$$

Particles are also identified from energy losses $\Delta E$ and $E$ by using the standard particle identification formula of the form $$(E+\Delta E)^\alpha - E^\alpha = T/a$$

where a is a constant proper to the particles, T is the thickness of the dE detector and $\alpha$ is a constant nearly equal to 1.73 for light ions.

In order to obtain good results in identification of particles, it is necessary to determine the value of the constant a from energy losses $\Delta E$ and $E$. It is easily seen from the above identification formula that the uniformity of thickness T of the dE detector should be very good for determining the constant a precisely.

In the case of identification of heavy ions, it is necessary to use a thin dE detector with a thickness less than 10 μm, because ranges of heavy ions are shorter than those of light ions. The thin dE silicon detector has been produced from epitaxial silicon wafer by etching off the highly doped substrate using a chemical preferential etching method or an electrochemical etching method. For obtaining a thin dE detector with a good thickness uniformity, a highly technical process by etching the substrate is required. Nevertheless, an additional irregularity of the thickness caused by etching is inevitable.

FIG. 2(a) shows the first embodiment of the present invention in which 1 is the dE detector and 2 is the E detector of the integrated solid state detector telescope. $A_1$ and $A_2$ are the electrodes of dE and E detectors. N is a high purity N type silicon substrate. B is a heavily doped N+ type silicon layer which is produced by diffusion of impure Antimony into the above mentioned N type silicon substrate and has a very low resistivity. A slightly doped N type silicon layer is produced on the above mentioned very low resistive N+ type silicon layer by using the epitaxial crystal growth technique. Electrodes $A_1$ and $A_2$ are produced by evaporation of gold in a vacuum on both sides of the silicon wafer forming surface barrier rectifying contacts. The very low resistive silicon layer B acts as an electrical shield between dE and E detectors and is connected to the ground in usual applications. ΔE and E are the signal outputs appearing on electrodes $A_1$ and $A_2$ of dE and E detectors corresponding to the energy losses of the incident charged particles in each detector.

FIG. 2(b) shows the potential distribution in the epitaxial integrated E-dE solid state detector telescope of the present invention. ΔV and V are voltages applied on the electrodes $A_1$ and $A_2$ in FIG. 2(a) respectively. These voltages have negative polarities and are reversely biasing dE and E detectors. Holes produced by incident charged particles are swept away into electrodes $A_1$ and $A_2$ from depletion layers of dE and E detectors by the fields of the potential shown in FIG. 2(b). On the other hand, electrons produced at the same time flow into the buried low resistive N+ type layer, which is connected to ground. Output signals ΔE and E are derived from the flow of carriers, holes and electrons.

In FIG. 3 are shown the geometry and the electrode configuration of one example of the present invention. The highly doped N+ type silicon layer has a thickness of 9 μm and is very thin. The epitaxial N type silicon layer is polished with a slight slope as shown in the figure. The ohmic contact with the buried N+ type silicon layer is produced by evaporation of gold in vacuum on the edge of the buried layer appearing on the polished surface.

The silicon wafer used here has a N—N+—N type complex structure. The highly doped N+ type silicon layer is produced by diffusion of Antimony into a high purity N type silicon substrate. The N type silicon layer is produced on the N+ type silicon layer by means of epitaxial crystal growth. Electrodes $A_1$ and $A_2$ are produced by evaporation of gold in a vacuum on both sides of the silicon wafer, forming surface barrier rectifying contacts.

FIG. 4 shows the profile of the spreading resistance of the epitaxial silicon wafer having N—N+—N type complex structure one example of the present invention. The thicknesses of N+ and N type silicon layers are 9 μm and 10 μm respectively. In this example of the present invention, resistivities of N+ and N type silicon layers are estimated to be 0.015 Ω-cm and 40 Ω-cm respectively from FIG. 4. The high purity N type silicon substrate is also estimated to have a resistivity of about 8kΩ-cm.

Figure 5:
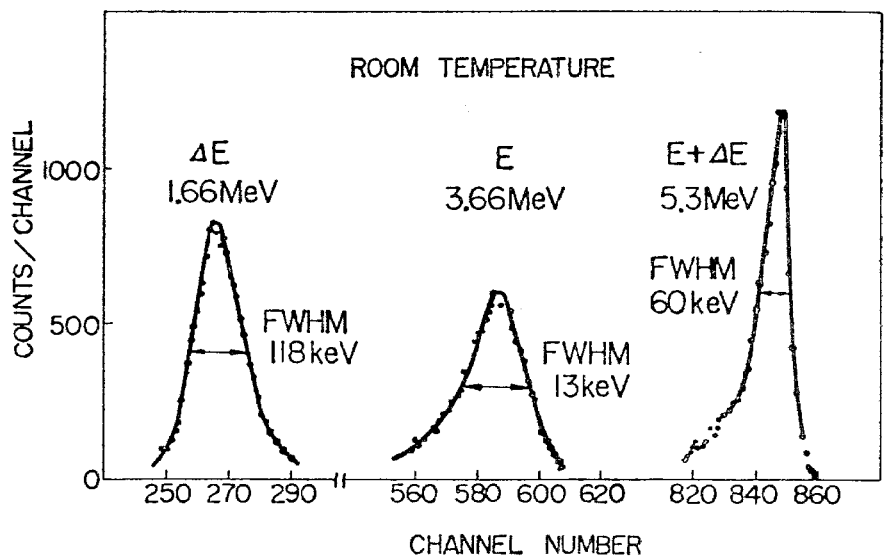
FIG. 5 shows graphs illustrating spectra of energy losses of α particles from $^{241}$Am in E and dE detectors and the spectrum of sum of energy losses E and dE.

FIG. 5 shows spectra of energy losses in dE and E detectors for α particles from $^{241}$Am. Energy resolutions of dE and E detectors are 118 keV and 130 keV respectively. In this measurement, bias voltages of dE and E detectors are 15 V and 180 V respectively. This figure also shows (E+ΔE) spectrum obtained by analog-summation of ΔE and E signals. The energy loss of this (E+ΔE) spectrum is 5.3 MeV and the energy resolution is 60 keV FWHM. The energy of particles from $^{241}$Am is 5.45 MeV, therefore the energy loss in the dead layer caused by the buried N+ type silicon layer is supposed to be 0.25 MeV. The thickness of the dead layer estimated from this value is less than 1 μm and is much smaller than that of the buried N+ type silicon layer. This is due to the fact that most of the free carriers produced in the buried layer are swept away into dE and E depletion layers by diffusion of carrier in cooperation with the effect of built-in fields in the buried layer.

The built-in potential difference V of two points in a semiconductor, where impurity concentrations are $N_{max}$ and $N_{min}$, is expressed as follows $$V = -(kT/q) \cdot \ln(N_{min}/N_{max})$$

From this equation, the built-in potential differences in the buried layer are estimated to be 0.21 V and 0.32 V in the sides of dE and E detectors and the corresponding electric fields are about 700 V/cm and 530 V/cm respectively. As seen from the result, the built-in fields are so high that the dead layer is confined to a narrow portion of the buried layer where the impurity concentration has a flat top.

As described in detail, the epitaxial integrated E-dE solid state detector telescope of the present invention has many advantages compared with the heretofore used one which is composed of dE and E detector produced individually.

The first advantage is that fabrication of this epitaxial integrated E-dE solid state detector telescope is simple and easy, because this eliminates the highly technical process of etching the substrate, which is necessary for fabrication of the conventional epitaxial silicon detector.

The second advantage is that the thickness uniformity of the dE detector does not suffer a degradation caused by etching and is very good. The third advantage is that the dead layer accompanied with the buried low resistive N+ type silicon layer, which is isolating the dE detector from the E detector electrically, is very thin because of the drift effect of carriers due to built-in fields.

The fourth advantage is that the epitaxial integrated solid state detector telescope minimizes the separation of dE and E detectors. This is effective for reducing the counting loss of the E detector caused by a scattering of incident particles in the dE detector.

The low resistive N+ type silicon layer shown in FIG. 3 and FIG. 4 are produced by using the impurity diffusion technique. Fabrication of the low resistive N+ type silicon layer is also possible by using an epitaxial crystal growth technique and an ion implantation technique.

The epitaxial integrated E-dE solid state detector telescope of the present invention may also be produced using a silicon wafer with a P—P+—P type complex structure. This type of the epitaxial integrated E-dE solid state detector telescope is the second embodiment of the present invention.

Electrodes $A_1$ and $A_2$ of FIG. 2 and FIG. 3, having rectifying characteristics, are surface barrier junctions produced by evaporation of gold in a vacuum on semiconductor surface Of course, other materials, having rectifying characteristics, are possible for producing the surface barrier junction. The semiconductor P-N junction instead of a surface barrier junction is also applicable as a rectifying junction. The epitaxial integrated E-dE solid state detector telescope having p-n junction type rectifying electrodes is the third embodiment of the present invention.

The epitaxial integrated E-dE solid state detector telescope of the present invention is also produced by using the other semiconductor material such as germanium and gallium arsenide.

What is claimed is:

1. An epitaxial integrated E-dE solid state detector telescope comprised of:
   a semiconductor having a complex structure comprising:
      a high purity semiconductor substrate providing an E detector,
      a low resistive heavily doped semiconductor layer on said substrate,
      a slightly doped semiconductor layer produced on said low resistive layer by epitaxial crystal growth providing a dE detector;
   rectifying electrodes on both sides of said semiconductor wafer;
   reverse biasing means reverse biasing said electrodes whereby depletion layers extend from outside toward said low resistive layer;
   said low resistive layer electrically isolating said dE detector from said E detector.

2. An epitaxial integrated E-dE solid state detector telescope as claimed in claim 1 in which said semiconductor wafer is a N type silicon wafer having a N−N+−N type complex structure.

3. An epitaxial integrated E-dE solid state detector telescope as claimed in claim 1 in which said semiconductor wafer is a P type silicon wafer having a P−P+−P type complex structure produced by eptiaxial crystal growth of a P type silicon layer on a heavily doped low resistive silicon layer deposited on a high purity P type silicon substrate.

4. An epitaxial integrated E-dE solid state detector telescope as claimed in claim 2 or 3 in which said heavily doped silicon layer is produced by an impurity diffusion technique.

5. An epitaxial integrated E-dE solid state detector telescope as claimed in claim 2 or 3 in which said heavily doped silicon layer is produced by an ion inplantation technique.

6. An epitaxial integrated E-dE solid state detector telescope as claimed in claim 2 or 3 in which said heavily doped silicon layer is produced by an epitaxial crystal growth technique.

7. An epitaxial integrated E-dE state detector telescope as claimed in claim 1 in which said rectifying electrodes are surface barrier type electrodes.

8. An epitaxial integrated E-dE solid state detector telescope as claimed in claim 1 in which said rectifying electrodes are p-n junction type electrodes.

9. An epitaxial integrated E-dE solid state detector telescope as claimed in claim 1 in which said low resistive layer provides an electrical shield between said E and dE detectors.

10. An epitaxial integrated E-dE solid state detector telescope as claimed in claim 1 in which said low resistive layer is comprised of a diffusion of impurity in said silicon substrate.

11. An epitaxial integrated E-dE solid state detector telescope as claimed in claim 10 in which said impurity is antimony diffused in said silicon substrate to provide said low resistive layer.

* * * * *